United States Patent
Doke et al.

(10) Patent No.: US 6,997,192 B2
(45) Date of Patent: Feb. 14, 2006

(54) CONTROL OF DISSOLVED GAS LEVELS IN DEIONIZED WATER

(75) Inventors: Nilesh S. Doke, Dallas, TX (US); Mona M. Eissa, Plano, TX (US); Jeffrey A. Hanson, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 420 days.

(21) Appl. No.: 10/318,688

(22) Filed: Dec. 13, 2002

(65) Prior Publication Data

US 2004/0112404 A1    Jun. 17, 2004

(51) Int. Cl.
*B08B 3/12*    (2006.01)

(52) U.S. Cl. .......................... 134/1.3; 134/21; 134/36; 134/184; 134/902

(58) Field of Classification Search ............ 134/1, 134/1.3, 2, 21, 102.1, 902, 184
See application file for complete search history.

(56) References Cited

U.S. PATENT DOCUMENTS

| 5,800,626 A | 9/1998 | Cohen et al. |
| 2003/0015216 A1 | 1/2003 | Nicolosi et al. |

OTHER PUBLICATIONS

Fred Wiesler, "Membranes, Membrane Contactors: An Introduction to the Technology" Ultrapure Water, pp. 27-31, May/Jun. 1996.

*Primary Examiner*—Zeinab El-Arini
(74) *Attorney, Agent, or Firm*—Rose Alyssa Keagy; W. James Brady, III; Frederick J. Telecky, Jr.

(57) ABSTRACT

An embodiment of the invention is an apparatus having a cleaning tank 2, a megasonic energy source 3, and an intake pipe 6 where a membrane contactor 9 is coupled to the intake pipe 6 to change the concentration of nitrogen gas in the deionized water 8 contained in intake pipe 6 to a range between 5.4% to 54% of saturation. Another embodiment is a method of changing the concentration of nitrogen gas in deionized water 8 to a range between 5.4% to 54% of saturation.

12 Claims, 1 Drawing Sheet

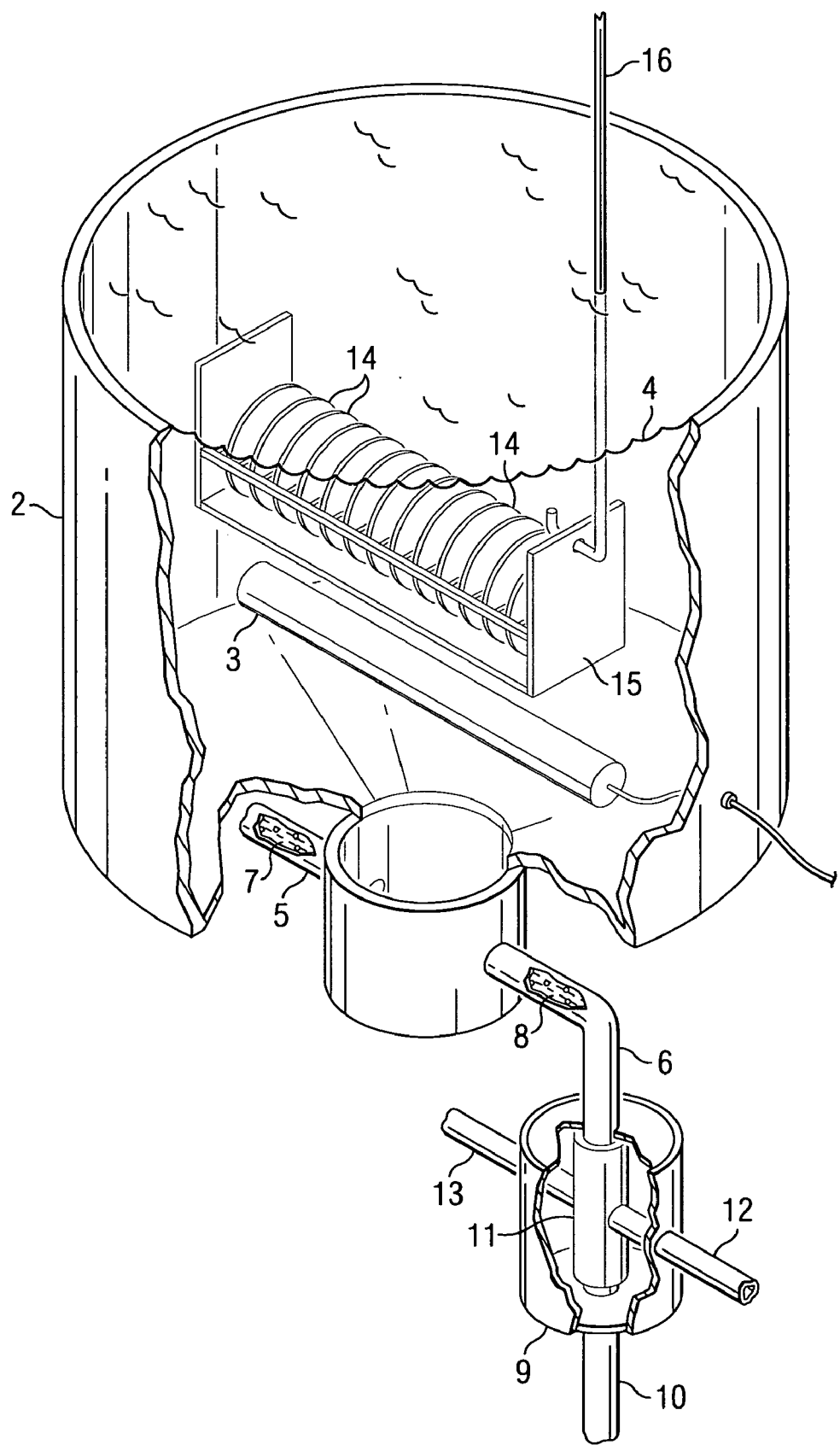

CONTROL OF DISSOLVED GAS LEVELS IN DEIONIZED WATER

BACKGROUND OF THE INVENTION

This invention relates to a method and apparatus for optimizing the level of dissolved gasses in the cleaning process that is used to clean wafers having an exposed copper surface.

BRIEF DESCRIPTION OF THE DRAWINGS

The drawing shows the apparatus for optimizing the level of dissolved gasses in a cleaning tank.

DETAILED DESCRIPTION OF THE INVENTION

Semiconductor manufacturing yield is affected by the quality of the wafer cleaning process. For example, the quality of the Chemical Mechanical Planarization ("CMP") clean, performed after a copper layer has been polished, affects the yield and reliability of the chips. The success of the CMP clean process using megasonic energy in a high pH solution is dependent on the level of dissolved gasses; namely dissolved nitrogen gas. If the level of dissolved nitrogen gases in the cleaning tank is too low then an unwanted level of defects (i.e. residue and particles) is left on the wafer. Conversely, if the level of dissolved nitrogen gasses in the cleaning tank is too high then an unwanted level of copper corrosion occurs. This invention relates to optimizing the level of dissolved gases in the cleaning process so that a "sweet spot" is found where clean-up residue and copper corrosion is minimized.

Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention.

Referring to the drawing, a cleaning tank 2 used in semiconductor manufacturing, such as a CMP cleaning tank, holds cleaning fluid 4 and has a megasonic transducer 3. As an example, the cleaning tank 2 may be found in a clean up hood, for example the Cobra model made by Verteq Corporation or a single wafer tank such as the Mirra/Mesa Integrated system made by Applied Materials. In the best mode application the megasonic transducer 3 operates at 350 W. However, it is within the scope of this invention to operate the transducer at a different power level, up to 500 W.

The cleaning fluid 4 is a solution created by the mixing of fluids from fluid intake pipes 5 and 6. Fluid intake pipe 5 contains a high pH solution 7 such as ESC774 from ESC Corporation; however, it is within the scope of this invention to use any high pH fluid (i.e. a fluid having a pH greater than 10). The high pH solution 7 removes slurry particles and carbon based residue from the wafers during the post-CMP clean process.

Fluid intake pipe 6 contains deionized water 8. In the best mode example, the level of dissolved nitrogen gas in the deionized water 8—and thereby the level of dissolved nitrogen gas in the cleaning fluid 4—is affected by a membrane contactor 9. The use of any membrane contactor is within the scope of this invention, but in the best mode application the membrane contactor is made by Liquicel membrane contactor, made by Membrana GmbH.

The deionized water enters the membrane contactor 9 from pipe 10. Upon entering the membrane contactor 9, the deionized water flows on the shell side of the hydrophobic internal membrane 11. The membrane contactor 9 can be used to change the level of dissolved gases in the fluid 8 passing through the membrane contactor 9 because the internal membrane 11 is porous to gasses but not to water. In the best mode application the membrane contactor is used to control the level of dissolved nitrogen gas in the deionized water 8 in pipe 6.

During CMP clean, the level of dissolved nitrogen gas is increased by adding nitrogen through intake 12. The nitrogen gas passes through the porous internal membrane 11 and into the flowing deionized water 8. Conversely, the level of dissolved nitrogen is decreased by applying a vacuum to intake 13. The vacuum pulls nitrogen from the deionized water through the porous membrane 11. After passing through the membrane contactor 9, the deionized water 8 continues through pipe 6 and into the cleaning tank 2 where it mixes with the high pH fluid 7 from pipe 5.

In the best mode application, semiconductor wafers 14 sit in a tray (or "boat") 15 that is suspended in the cleaning fluid 4 by a robot arm 16. For a stated megasonic power level on the transducer 3, increasing the level of dissolved nitrogen gas causes more cavitations resulting from the cleaning fluid 4 interfacing with the copper interconnects on the wafers 14. However, if the level of dissolved nitrogen gas in the cleaning fluid 4 is too high than an unacceptable level of copper corrosion occurs, thereby decreasing the yield of the wafers 14. Conversely, for a stated megasonic power level on transducer 3, if the level of dissolved nitrogen in the cleaning fluid 4 is too low then a residue of slurry, carbon based residue, particles and/or pad fragments from the CMP process remains on the wafers 14—also decreasing the yield. Therefore, there is an optimum level of dissolved gases for cleaning fluid 4 where the levels of residue defects and corrosion are minimized.

Tests conducted on the best mode application show that the optimum upper limit of dissolved nitrogen gasses in cleaning fluid 4 is 27% saturation; however, levels up to 54% saturation are acceptable. Tests also showed that increasing the level of dissolved nitrogen gas from 54% to 86.5% saturation caused the corrosion defect level to increase from 40 to 15,000 ppm (for a particle size of 0.15 $\mu$m or greater). Furthermore, at the 86.5% saturation level, tests conducted using a KLA SP1 (measurement tool made by KLA Tencor) showed that the amount of haze (which is an indication of copper roughness or corrosion) was eight times greater.

However, there is also a minimum effective level of dissolved nitrogen gas. The defects from the CMP process will not be removed from the wafers 14 unless there is a minimum level of dissolved nitrogen gasses of approximately 5.4% of saturation. A level of dissolved nitrogen gasses above 10.8% of saturation is optimal.

Various modifications to the invention as described above are within the scope of the claimed invention. As an example, instead of cleaning a boat of wafers, the wafers could be cleaned individually. Also, instead of controlling the level of dissolved nitrogen gas in the deionized water using the membrane contactor, other gases in the deionized water could be controlled using a membrane contactor. Furthermore, the level of dissolved gasses could be controlled on another intake pipe (such as the high pH fluid pipe) or could be controlled by sending the mixture of deionozed water 8 and high pH fluid 7 through the membrane contactor 9 after the fluids are mixed but before they enter the cleaning tank 2.

It is within the scope of the invention to monitor the level of dissolved gasses at any point in the cleaning process (i.e. by evaluating a sample stream using an analyzer made by Orbisphere to monitor the deionized water 8 exiting the membrane contactor). In addition, the functions comprehended by the invention could be accomplished in various stages of the manufacturing process, such as the post probe clean (using, for example, the model FC820 wet hood from DNS Incorporated). Specifically, this invention can be used with any cleaning tool that uses megasonic energy to clean exposed copper surfaces on wafers. For example, the megasonic station on the Ontrak & Lam Synergy cleaners, the megasonic tank on the Mesa, or any Goldfinger megasonic station. Lastly, the transducer 3 could be one or more objects of any shape and located anywhere within or around the cleaning tank 2.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A cleaning method comprising:
    performing a post-Chemical Mechanical Planerization clean of at least one semiconductor wafer that is submerged in a cleaning tank, said cleaning tank having a fluid input containing deionized water;
    wherein a level of a dissolved nitrogen gas in said deionized water is changed, using a membrane contactor, to a partial saturation range between 5.4% to 54% of saturation.

2. The method of claim 1 wherein said membrane contactor changes said level of dissolved nitrogen gas by adding dissolved nitrogen gas to said deionized water.

3. The method of claim 1 wherein said membrane contactor changes said level of dissolved nitrogen gas by applying a vacuum to said deionized water.

4. The method of claim 1 wherein said at least one semiconductor wafer contains an exposed surface of a copper feature.

5. A cleaning method comprising:
    performing a megasonic-assisted cleaning of at least one semiconductor wafer that is submerged in a cleaning solution containing water wherein a level of a nitrogen gas in said water is increased, using a membrane contactor, to a range between 5.4% and 54% of saturation before said water is mixed with said cleaning solution.

6. The method of claim 5 wherein said membrane contactor changes said level of nitrogen gas by adding nitrogen gas to said water.

7. The method of claim 5 wherein said membrane contactor changes said level of nitrogen gas to 27% of saturation.

8. The method of claim 5 wherein said at least one semiconductor wafer contains an exposed surface of a copper feature.

9. A cleaning method comprising:
    performing a megasonic-assisted cleaning of at least one semiconductor wafer that is submerged in a cleaning solution containing water wherein a level of a nitrogen gas in said water is decreased, using a membrane contactor, to a range between 5.4% and 54% of saturation before said water is mixed with said cleaning solution.

10. The method of claim 9 wherein said membrane contactor changes said level of nitrogen gas to 27% of saturation.

11. The method of claim 9 wherein said membrane contactor changes said level of nitrogen gas by applying a vacuum to said water.

12. The method of claim 9 wherein said at least one semiconductor wafer contains an exposed surface of a copper feature.

* * * * *